(12) United States Patent
Hosono

(10) Patent No.: US 7,299,438 B2
(45) Date of Patent: Nov. 20, 2007

(54) METHOD AND APPARATUS FOR VERIFYING SEMICONDUCTOR INTEGRATED CIRCUITS

(75) Inventor: Toshikatsu Hosono, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 62 days.

(21) Appl. No.: 11/080,555

(22) Filed: Mar. 16, 2005

(65) Prior Publication Data
US 2006/0109032 A1    May 25, 2006

(30) Foreign Application Priority Data
Nov. 25, 2004 (JP) .............................. 2004-340797

(51) Int. Cl.
*G06F 17/50* (2006.01)
(52) U.S. Cl. ............................................ 716/6; 703/19
(58) Field of Classification Search ................... 716/6, 716/2; 703/19
See application file for complete search history.

(56) References Cited

U.S. PATENT DOCUMENTS

| | | | |
|---|---|---|---|
| 4,047,057 A * | 9/1977 | Ahmed ........................ | 327/176 |
| 5,222,028 A * | 6/1993 | LaBarre et al. ............... | 702/73 |
| 5,239,481 A * | 8/1993 | Brooks et al. ................. | 716/6 |
| 6,499,334 B1 * | 12/2002 | Kobayashi .................... | 73/1.42 |
| 6,643,828 B2 * | 11/2003 | Naffziger et al. .............. | 716/2 |
| 2003/0223278 A1 * | 12/2003 | Gomm et al. ............... | 365/194 |
| 2004/0099883 A1 * | 5/2004 | Jung ........................... | 257/200 |
| 2005/0039094 A1 * | 2/2005 | Yan ........................... | 714/726 |
| 2005/0081171 A1 * | 4/2005 | Kawano et al. ................ | 716/6 |
| 2005/0091620 A1 * | 4/2005 | Aipperspach et al. .......... | 716/6 |

FOREIGN PATENT DOCUMENTS

JP       2001-184372       7/2001

* cited by examiner

*Primary Examiner*—Jack Chiang
*Assistant Examiner*—Suchin Parihar
(74) *Attorney, Agent, or Firm*—Staas & Halsey LLP

(57) ABSTRACT

A timing verification apparatus calculates a pulse width variation coefficient based on a pulse width of an input clock signal, a delay value of the clock signal, and an operation frequency. The apparatus then calculates the pulse width for a delayed clock signal provided to a clock input terminal of a flip flop (FF) using the pulse width variation coefficient. Further, the apparatus compares the calculated pulse width with a standard value. The timing verification apparatus calculates the pulse width of the delayed clock signal provided to the clock input terminal of the FF using the pulse width of the clock signal, and a rise delay and a fall delay of the path. The apparatus considers on-chip variations and accurately executes timing verification for signals.

16 Claims, 11 Drawing Sheets

Fig.16

| | Min Value | | Max Value | Unit |
|---|---|---|---|---|
| Power Supply Voltage | 1.012 | to | 1.30 | [V] |
| Guaranteed Operation Temperature | -40 | to | 125 | [°C] |
| Internal IR Drop Amount (Both-Side Value) | | | 50 | [mV] |
| Distance p-distance from Periphery (no drop) to Peak | | | 3.0 | [mm] |
| Power Supply Gradient Tendency f(x) | default=2 | | 2 | |
| Circuit Stage Number n In Path | Option | | n | |
| Wiring Length Limitation Value | default=1.2mm | | 1.2 | [mm] |

| Operation Environment | Calculation Condition | | | | Default OCV Coefficient OCV_p*OCV_t*OCV_v | | |
|---|---|---|---|---|---|---|---|
| | Device Variation | Chip Internal Voltage | Chip Internal Temperature | Correction | Tgate | Timing | Tline |
| max/max | 1 | 1.012 | 125 | 1 | 1.00 | 1.00 | 1.00 |
| max/min | 0.025 | 1.038 | 120 | -0.01 | 0.93 | 0.92 | 0.92 |
| min/max | -0.025 | 1.259 | -35 | 0.01 | 1.11 | 1.05 | 1.10 |
| min/min | -1 | 1.300 | -40 | 1 | 1.00 | 1.00 | 1.00 |

Fig.17 (Prior Art)

| | Min Value | | Max Value | Unit |
|---|---|---|---|---|
| Power Supply Voltage | 1.012 | to | 1.30 | [V] |
| Guaranteed Operation Temperature | -40 | to | 125 | [°C] |
| Internal IR Drop Amount (Both-Side Value) | | | 50 | [mV] |

| Operation Environment | Calculation Condition | | | | Default OCV Coefficient OCV_p*OCV_t*OCV_v | | |
|---|---|---|---|---|---|---|---|
| | Device Variation | Chip Internal Voltage | Chip Internal Temperature | Correction | Tgate | Timing | Tline |
| max/max | 1 | 1.01 | 125 | 1 | 1.00 | 1.00 | 1.00 |
| max/min | 0.025 | 1.06 | 120 | 0.95 | 0.86 | 0.87 | 0.92 |
| min/max | -0.025 | 1.25 | -35 | 1.05 | 1.16 | 1.08 | 1.10 |
| min/min | -1 | 1.30 | -40 | 1 | 1.00 | 1.00 | 1.00 |

US 7,299,438 B2

METHOD AND APPARATUS FOR VERIFYING SEMICONDUCTOR INTEGRATED CIRCUITS

CROSS-REFERENCE TO RELATED APPLICATIONS

This application is based upon and claims the benefit of priority from the prior Japanese Patent Application No. 2004-340797, filed on Nov. 25, 2004, the entire contents of which are incorporated herein by reference.

BACKGROUND OF THE INVENTION

The present invention relates to a method and apparatus for verifying semiconductor integrated circuits.

The development of semiconductor integrated circuits includes the process of calculating delays in a logic circuit and verifying operation timings and delays in the logic circuit to check and ensure proper operation of the logic circuit. In recent years, semiconductor integrated circuits have a higher level of integration and operate at higher speeds and lower operation voltages. In such semiconductor integrated circuits, variations in power supply voltage drops within chips greatly affect delays and fluctuations in circuit operations. Thus, static timing analysis (STA) must be executed by taking into consideration such differences.

When designing a semiconductor integrated circuit in the prior art, a netlist is first generated through logical synthesis, and then a chip layout is generated based on the netlist. The STA is executed based on the layout result.

FIG. 1 is a flowchart showing a timing verification process in the prior art. This process is executed by a verification apparatus (not shown).

First, the verification apparatus estimates variations in the power supply voltage drop of a chip-shaped semiconductor integrated circuit (step 101), extracts the parasitic capacitance of the circuit based on the layout of the semiconductor integrated circuit (the arrangement and wiring of instances (cells)) (step 102), and calculates a delay value (step 103). Next, the verification apparatus executes a path analysis to extract a data path and a clock path (step 104) and then executes a pulse width check (step 105) and a timing check (step 106) for each path using the delay value. Then, the verification apparatus determines the appropriateness of the layout based on the results of these checks (step 107).

Variations in processes for forming transistors and wires in semiconductor integrated circuits and variations in power supply voltages and temperatures of semiconductor integrated circuits affect the delay time of cells included in semiconductor integrated circuits. Therefore, the verification apparatus estimates the amount of variation of these variation factors. The verification apparatus then expresses the influence of each variation factor on delays as an on-chip variation coefficient (OCV coefficient), based on the estimated variation amount. The verification apparatus multiplies a delay value by the OCV coefficient to obtain a delay value taking on-chip variations into consideration. The verification apparatus executes the timing check and the pulse width check using the calculated delay value.

For example, as shown in FIG. 2(a), a chip-shaped semiconductor integrated circuit includes a flip flop circuit 112, which receives a clock signal CK via plural stages of buffer circuits 111. In the pulse width check, the pulse width of the clock signal CK at a clock input terminal 112a of the flip flop circuit 112 is checked. The clock signal CK is subjected to a path delay by the plural stages of buffer circuits 111 and reaches the flip flop circuit 112 as a clock signal CKn having the path delay. The pulse width PWn of the clock signal CKn is calculated using the pulse width PWH of the clock signal CK and a rise delay time PR and a fall delay time PF between the source of the clock signal CK (e.g., an external input terminal) and an input terminal of a buffer circuit 111. In short, the pulse width PWn is calculated using the expression PWn=PWH+PF−PR.

The rise delay time PR is the delay time of the rising edge of the clock signal CKn with respect to the rising edge of the clock signal CK. The fall delay time PF is the delay time of the falling edge of the clock signal CKn with respect to the falling edge of the clock signal CK. In this case, the maximum value of rise delay times considering delay variations is used as the rise delay time PR, and the minimum value of fall delay times considering delay variations is used as the fall delay time PF. In the prior art, the pulse width check is executed by comparing the pulse width PWn calculated using the above expression with a standard value tPW of a target cell (the flip flop circuit 112 in this case). The rise delay time PR is set at its maximum value and the fall delay time PF is set at its minimum value so that the pulse width check is executed under a harsh condition in which the difference between the rise delay time PR and the fall delay time PF is large.

Japanese Laid-Open Patent Publication No. 2001-184372 discloses a method for verifying pulse width using the above expression. For example, as shown in FIG. 3(a), a semiconductor integrated circuit includes two flip flop circuits 113 and 114. In this case, the timings of a data signal (Data) and a clock signal (CK), which are respectively provided to input terminals 114a and 114b of the flip flop circuit 114, are checked. In the timing check considering on-chip variations, strict checking is performed taking into consideration delay variations of one of the data signal (Data) and the clock signal (CK).

SUMMARY OF THE INVENTION

However, when the number of buffer circuits 111 increases as shown in FIG. 2(a), the amount of delay variations accumulated from the input terminal of the clock signal CK to the input terminal of the flip flop circuit 112 is large. In this case, the signal may have an extremely short pulse width, with its rising edge being close to its falling edge. If this happens, the pulse width of signals provided to input terminals of many circuits is determined as having an error. This requires such measures as delaying signal timings to be taken, and as a result, lengthens the design time for semiconductor integrated circuits.

A rise delay and a fall delay of a signal output from a cell (a buffer circuit 111 in this case) influences the pulse width of the signal. In an actual circuit, it is extremely unlikely that only one of a rising edge and a falling edge of a signal varies in all circuit devices. In other words, it is unlikely that only one of a rise delay and a fall delay of a signal output from a cell varies because of an influence by delay variations within chips. However, only one of a rise delay and a fall delay is set to consider delay variations in the timing verification of the prior art. In other words, the timing verification of the prior art uses a rise delay time and a fall delay time set under different conditions. Thus, the prior art verification fails to provide a correct verification result.

Further, in the timing check, delay variations caused by on-chip variations are set at maximum values of factors of delay variations in the chip (process, temperature, voltage, etc.). Thus, the timing check may be executed under an extremely strict condition, or under an impractical condition. For example, as shown in FIG. 3(b), a clock signal CK needs a predetermined hold time HT of data Data, to enable a flip flop to operate normally. However, when the timing check considering delay variations of the clock signal CK is executed, the hold time HT may fail to satisfy its standards (the hold time HT may be shorter than its standard time). If this happens, the operation of the flip flop is not ensured. In this case, the timings of signals provided to input terminals of many circuits are determined as having an error. This requires such measures as delaying signal timings to be taken, and as a result, lengthens the design time of semiconductor integrated circuits.

The present invention provides a method and apparatus that enable accurate verifying while considering on-chip variations.

One aspect of the present invention is a method for verifying a pulse width of a signal that is delayed when passing through an instance. The method includes calculating a pulse width variation coefficient that is based on the pulse width of the signal and a delay value of the signal, calculating a pulse width for the delayed signal using the pulse width variation coefficient, and comparing the calculated pulse width of the delayed signal with a standard value.

Another aspect of the present invention is an apparatus for verifying a pulse width of a signal that is delayed when passing through a circuit device. The apparatus includes a processing unit having a calculation unit and a comparison unit. The calculation unit calculates a pulse width variation coefficient, based on the pulse width of the signal and a delay value of the signal, and calculates a pulse width of the delayed signal using the pulse width variation coefficient. The comparison unit compares the calculated pulse width of the delayed signal with a standard value.

A further aspect of the present invention is a method for verifying timing of a signal that is delayed when passing through at least two paths. The method includes determining a delay variation amount entirely for the at least two paths, converting the delay variation amount into a delay coefficient for each path, calculating a delay value entirely for the at least two paths based on the delay coefficient, and verifying the timing of the signal based on the calculated delay value.

A further aspect of the present invention is an apparatus for verifying timing of a signal that is delayed when passing through at least two paths. The apparatus includes a processing unit having a determination unit, a calculation unit, and a verification unit. The determination unit determines a delay variation amount entirely for the at least two paths. The calculation unit converts the delay variation amount into a delay coefficient for each path and calculates a delay value entirely for the at least two paths based on the delay coefficient. The verification unit verifies the timing of the signal based on the calculated delay value.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 16 is a diagram showing OCV coefficients;

FIG. 17 is a diagram showing OCV coefficients in the prior art; and

DETAILED DESCRIPTION OF THE PREFERRED EMBODIMENTS

A timing verification apparatus 11 according to a preferred embodiment of the present invention will now be discussed, with reference to FIGS. 4 to 18.

Figure 5:
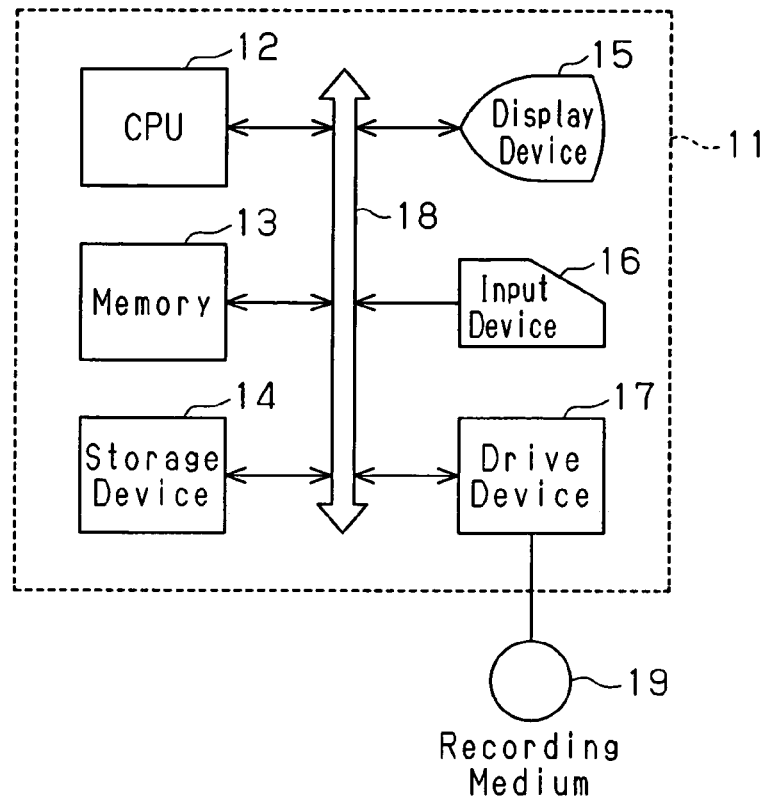
FIG. 5 is a schematic block diagram of a timing verification apparatus according to the first embodiment.

FIG. 5 is a schematic block diagram of the timing verification apparatus 11.

The timing verification apparatus 11 is a computer aided design (CAD) apparatus, and includes a central processing unit (CPU) 12, a memory 13, a storage device 14, a display device 15, an input device. 16, and a drive device 17, which are connected to one another via a bus 18. The CPU 12 functions as a calculation means, a comparison means, a determination means, and a verification means.

The CPU 12 executes a program using the memory 13 to execute a timing verification process. The memory 13 stores programs and data necessary for achieving a timing verification function. The memory 13 includes a cache memory, a system memory, and a display memory (not shown).

The display device 15 is used to display a layout screen, a parameter input screen, etc. The display device 15 may normally be a cathode-ray tube (CRT), a liquid crystal display (LCD), or a plasma display panel (PDP) (not shown). The input device 16 is used by a user to input requests, instructions, and parameters. The input device 16 includes a keyboard and a mouse (not shown).

The storage device 14 may normally be a magnetic disk unit, an optical disc unit, or a magneto-optical disc unit. The storage device 14 stores program data (hereafter referred to as "programs") and various file data (hereafter referred to as "files") used in the timing verification process, which will be described later. In response to an instruction input via the input device 16, the CPU 12 transfers programs and various files of data to the memory 13 to execute processing according to the programs. The storage device 14 may be used as a database.

A recording medium 19 stores programs executed by the CPU 12. The CPU 12 accesses the recording medium 19 with the drive device 17 to read a program from the recording medium 19 and install the program in the storage device 14.

The recording medium 19 may include computer-readable storage mediums, such as a memory card, a flexible disk, optical discs (CD-ROM, DVD-ROM, etc.), and magneto-optical discs (MO, MD, etc.) (not shown). The above programs may be stored in the recording medium 19, and the programs stored in the recording medium 19 may be loaded to the memory 13 for use when necessary.

The recording medium 19 includes a-disk unit, which is a medium recording programs that have been uploaded or downloaded via a communication medium. In addition to a storage medium storing programs that are directly executed by a computer, the recording medium 19 may be a storage medium storing programs that are executed when installed in another storage medium (a hard disk, etc.) or a storage medium storing encrypted programs or compressed programs.

Figure 1:
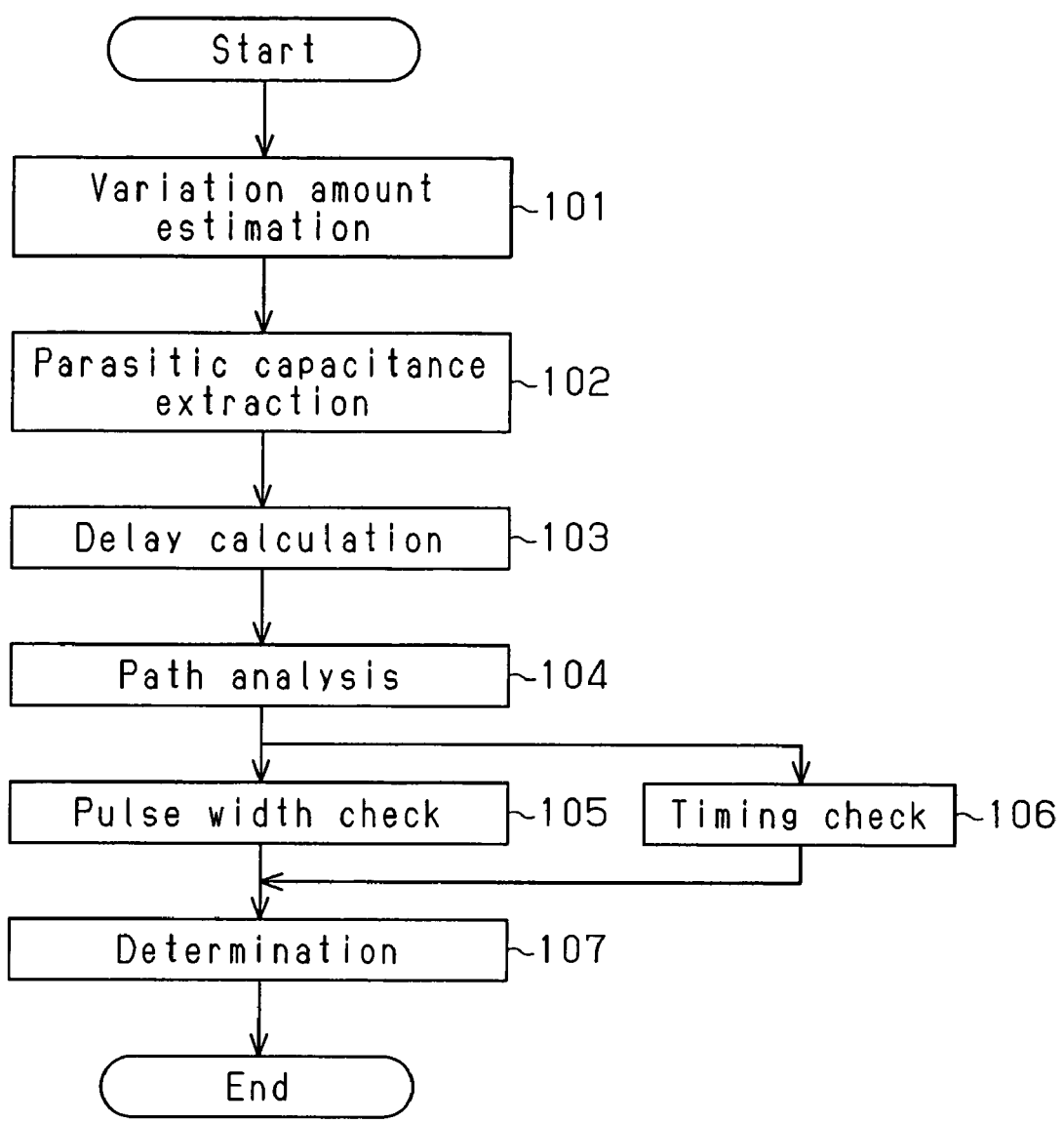
FIG. 1 is a flowchart showing a timing verification process in the prior art;.
Figure 2A:
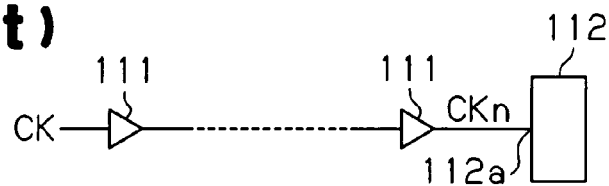
FIG. 2(a) is a schematic circuit diagram showing a path.
Figure 2B:
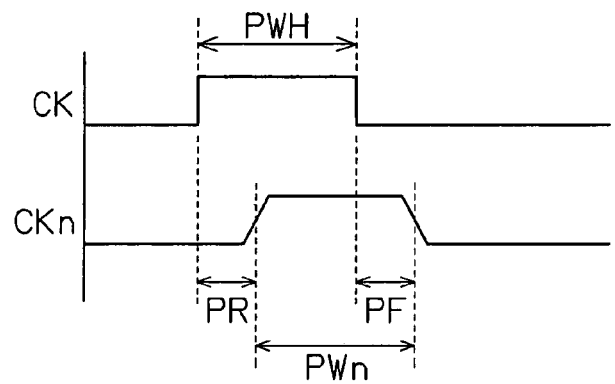
FIG. 2(b) is a waveform diagram of signals provided to the path of FIG. 2(a)
Figure 3A:
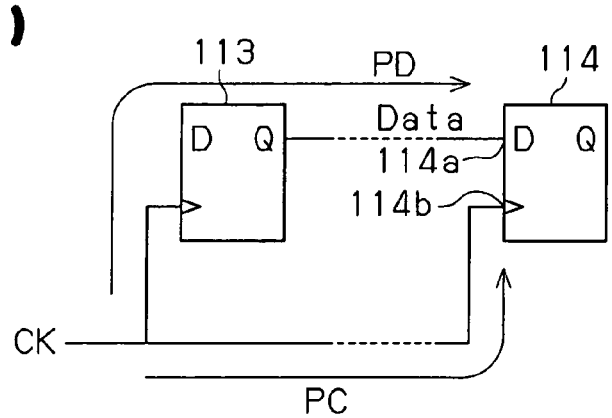
FIG. 3(a) is a schematic circuit diagram showing a path.
Figure 3B:
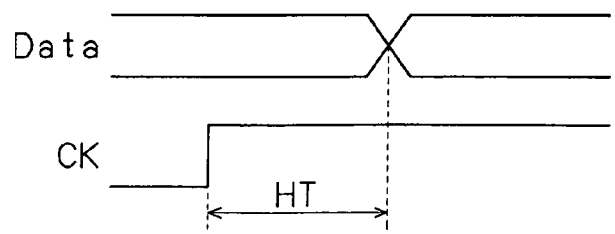
FIG. 3(b) is a waveform diagram of signals provided to the path of FIG. 3(a)
Figure 4:
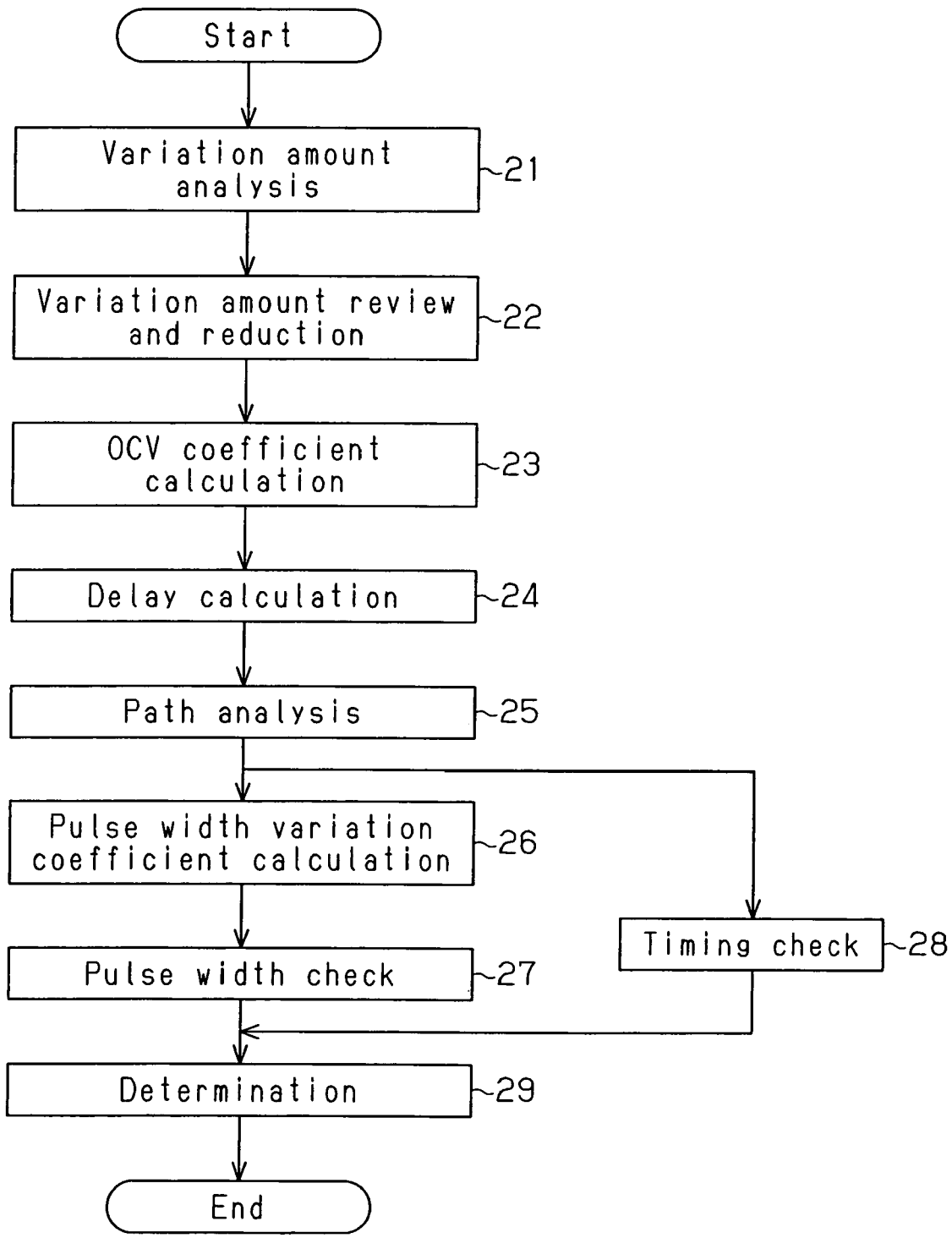
FIG. 4 is a flowchart showing a timing verification process according to a preferred embodiment of the present invention.

FIG. 4 is a flowchart showing a timing verification process executed by the timing verification apparatus 11.

In step 21, the timing verification apparatus 11 estimates the variation amount of each device of a semiconductor integrated circuit or the variation amount of each factor in the process for forming the semiconductor integrated circuit (variation amount estimation process). In step 22, the timing verification apparatus 11 considers the design conditions of the semiconductor integrated circuit and reviews (mainly reduces) the variation amount (variation amount review and reduction process). The design conditions include the number of circuit stages and distributions within the chip (voltage distribution and temperature distribution). The timing verification apparatus 11 sets the arrangement positions of instances (cells) based on the design conditions and calculates the potential and the temperature of each instance in the circuit. Then, the timing verification apparatus 11 calculates a variation amount that is to be considered as a delay value for each path (path delay) based on the potential and the temperature of each instance included in the path.

Next, in step 23, the timing verification apparatus 11 calculates the on-chip variation coefficient (OCV coefficient) based on the variation amount. In this step, the timing verification apparatus 11 calculates the OCV coefficient using process, voltage, temperature, and delay characteristic values. In step 24, the timing verification apparatus 11 calculates the delay value taking into consideration variations using the OCV coefficient (delay calculation process).

Next, in step 25, the timing verification apparatus 11 extracts a path for transmitting a data signal (data path) and a path for transmitting a clock signal (clock path) (path analysis process). In step 26, the timing verification apparatus 11 calculates the pulse width variation coefficient taking into consideration variations (variation coefficient calculation process). In this step, the timing verification apparatus 11 calculates the pulse width variation coefficient based on characteristic information of the pulse width, the PTV condition, the pulse width of the input clock signal, the time required for the input clock signal to reach the CK terminal, the cell type, etc., which are extracted in advance.

Next, the timing verification apparatus 11 executes a pulse width check process (pulse width analysis) in step 27. In this process, the timing verification apparatus 11 calculates a pulse width including a variation amount based on the calculated pulse width variation coefficient, and compares the calculated pulse width with a standard value. In step 28, the timing verification apparatus 11 executes a timing check process (timing verification) based on the delay value for the path calculated in step 24.

In step 29, the timing verification apparatus 11 determines whether the design of the semiconductor integrated circuit is appropriate based on the comparison result in step 27 and the verification result in step 28 (whether the verification results (the pulse width and the timing margin) fall within a set specification range).

The pulse width verification will now be described in detail.

[Variations in Pulse Width]

In the prior art methods, a pulse width whose characteristics vary is expressed using a delay value considering variations. In particular, one of a delay value for the rising edge (rise delay value) and a delay value of the falling edge (fall delay value) is a delay value considering variations. The rising edge and the falling edge form a pulse. In this way, the conventional methods check pulse width as determined by the rise delay value and the fall delay value, which are calculated under different conditions.

Figure 6A:
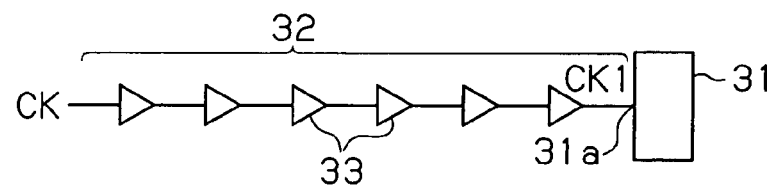
FIG. 6(a) is a schematic circuit diagram showing a path.
Figure 6B:
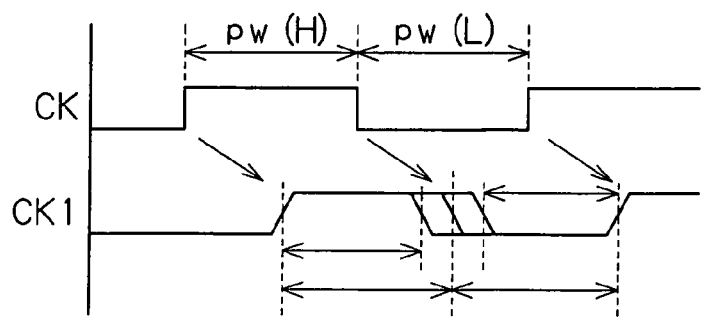
FIG. 6(b) is a waveform diagram of signals provided on the path of FIG. 6(a)

The timing verification apparatus 11 of the present embodiment defines a pulse width characteristic variation coefficient and expresses a pulse width whose characteristics vary using the pulse width variation coefficient. For example, as shown in FIG. 6(*a*), a semiconductor integrated circuit includes a path 32 for transmitting a clock signal CK to a flip flop (FF) 31. The path 32 includes a plurality of cells 33. The clock signal CK is provided to the FF 31 via the plurality of cells 33. As shown in FIG. 6(*b*), the pulse width of a signal CK1 provided to an input terminal 31a of the FF 31 differs from the pulse width of the clock signal CK. The difference between the signals is caused by delays and variations occurring in the path 32.

A high (H) level pulse width wF (H) of the signal CK1 in a subject instance (cell), or in the clock input terminal 31a of the FF 31, is calculated using the expression $$wF(H) = (pw(H) + Df - Dr) * K,$$

in which pw(H) represents the pulse width of an input signal, that is, the clock signal CK (H level), Dr represents a rise delay value, Df represents a fall delay value, and K represents a pulse width variation coefficient.

To be specific, the pulse width wF(H) is expressed using the rise delay value Dr and the fall delay value Df under the same condition, and is obtained by multiplying the pulse width (pw(H)+Df−Dr) of the clock signal CK1, which has reached the input terminal of the FF 31 via the path 32, by the pulse width variation coefficient K.

The pulse width variation coefficient K is set at a value equal to or smaller than one. The pulse width variation coefficient K is set at a smaller value as the variations occurring in the path increases. To enable circuit devices such as an FF to operate normally, care must be taken when the pulse width becomes short due to variations. A short setup time or a short hold time at an input terminal of the FF caused by such a short pulse width disables correct holding of data.

[Definition of Pulse Width Variation Coefficient]

The pulse width variation coefficient K is expressed as the ratio of a pulse width taking into consideration variations (pulse width during a variation) to a pulse width set as a reference.

For example, the pulse width variation coefficient K (w) for a pulse width for the worst process is set as the reference expressed as $$K(w)=(\text{pulse width during a variation})/(\text{pulse width for the worst process}).$$

The pulse width variation coefficient for a pulse width for the best process can also be expressed likewise.

[Conditions to be Taken into Consideration in Variation of Pulse Width]

The pulse width variation coefficient K is calculated using the pulse width during a variation as a numerator for the expression of the coefficient. Thus, variations of both the rising edge and the falling edge can be considered in the calculation of the pulse width variation.

In the same manner as in the prior art methods, the process variation amount may be defined, the pulse width when a process variation occurs may be evaluated, and the pulse width resulting from the evaluation may be used as a pulse width when a process variation occurs. However, to ensure the circuit characteristics, it is preferred that the pulse width during a variation be set under a condition in which the pulse width becomes minimal. The condition in which an H level pulse width becomes minimal is when the rising edge is delayed and the falling edge is advanced. For example, the condition in which the pulse width becomes minimal in a CMOS circuit corresponds to a case in which for the driving capability of each transistor having no variations, the driving capability of a P-channel MOS transistor is large and the driving capability of an N-channel MOS transistor is small. Even such a case is considered when the value of the pulse width variation coefficient K is set.

[Pulse Width Variation Factors of Circuit Variables]

As described above, the pulse width is expressed as $$wF(H)=(pw(H)+Df-Dr)* K.$$

The pulse width variation coefficient K changes according to the relationship between the pulse width pw(H) at an input terminal and an absolute value |Df−Dr| of a difference between a rise delay and a fall delay.

For example, a fall delay and a rise delay in the worst process are referred to as "fallmax" and "risemax" (fallmax<risemax), respectively. A fall delay and a rise delay in variation-considered case are referred to as "falls" and "rises" (where falls<rises), respectively. The "fallmax" and "risemax" are stored in a data library, which is used for designing. The "falls" and "rises" are calculated by simulation.

The absolute value of a difference between the fall delay and the rise delay in the worst process and an absolute value of a difference between the fall delay and the rise delay when a variation occurs are assumed to have the relationship |fallmax−risemax|<<|falls−rises|. In this case, the pulse width variation coefficient K is calculated using the expression $$K=(pw(H)+\text{falls}-\text{rises})/(pw(H)+\text{fallmax}-\text{risemax}).$$

The pulse width wF(H) considering variations is calculated using the pulse width variation coefficient K, which is calculated using the above expression. The pulse width pw(H) is set for each individual semiconductor integrated circuit chip. The rise delay value Df and the fall delay value Dr reflect results of path tracing.

The pulse width may vary due to factors (a) to (c) listed below. The factors to be considered here are such factors that cause the pulse width to be smaller, that is, such factors that cause the value of the numerator of the above expression to be smaller.

(a) Input Pulse Width [pw(H)]

The pulse width variation coefficient K decreases as the pulse width of the input signal decreases.

(b) Number of Circuit Stages in the Path

The pulse width variation coefficient K decreases as the number of circuit stages in the path increases. When a difference between the fall delay value and the rise delay value per circuit stage (per circuit element such as buffer) is set at a fixed value, the difference between the fall delay value and the rise delay value increases as the number of circuit stages increases. This decreases the pulse width variation coefficient K.

(c) Cell Dependency

The pulse width variation coefficient K decreases as the difference between the fall delay value and the rise delay value increases as the delay value of the path cumulates due to the cells forming the circuit. The difference between the fall delay value and the rise delay value is maximal when the same phase is repeated, that is, when a plurality of true logic cells are connected.

The pulse width variation is evaluated in view of these factors, and the evaluation result is considered as variations in the pulse width. This enables the evaluated pulse width variation to be reflected in the circuit characteristics.

The pulse width of the input signal may be replaced by an operation frequency of the circuit. The number of circuit stages in the path may be replaced by a delay value of the input signal. The operation frequency and the delay value of the input signal are parameters that can be easily obtained when designing of the chip. Thus, the pulse width variation coefficient can be expressed using its correlation with the operation frequency or with the delay value of the input signal.

Figure 7A:
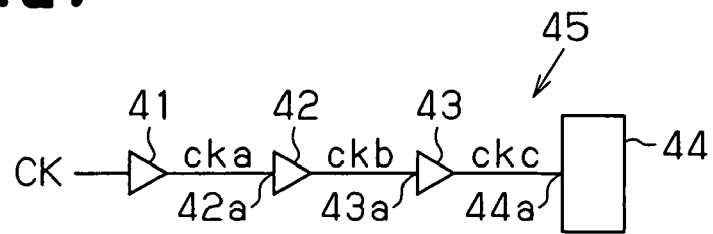
FIG. 7(a) is a schematic circuit diagram showing a path.
Figure 7B:
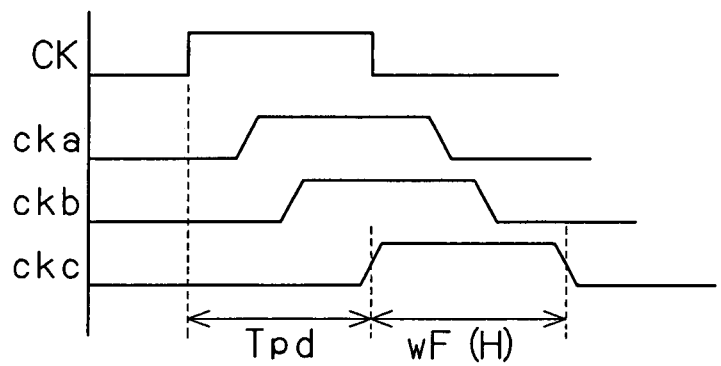
FIG. 7(b) is a waveform diagram of signals provided to the path of FIG. 7(a)

For example, as shown in FIG. 7(a), a path 45 provides a clock signal CK from an input terminal to a clock input terminal 44a of an FF 44, via three buffer circuits 41, 42, and 43. In the path 45, a signal cka at an input terminal 42a of the second stage buffer circuit 42 and a signal ckb at an input terminal 43a of the third stage buffer circuit 43 are delayed when passing through the cell of the preceding stage. Likewise, a signal ckc at an input terminal 44a of the FF 44 is delayed via the three preceding cell stages. Thus, as shown in FIG. 7(b), a time difference between a rising edge of the clock signal CK and a rising edge of the signal ckc corresponds to a path delay value Tpd.

Figure 8:
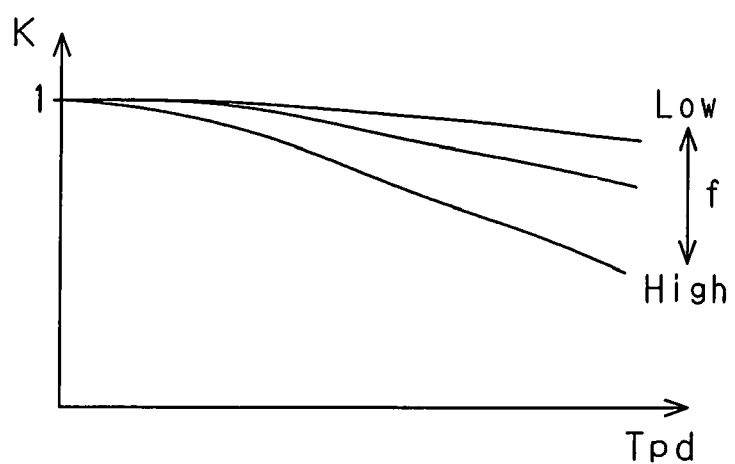
FIG. 8 is a graph showing the relationship between the delay value and the variation coefficient.

When a signal having repeated pulses, like the clock signal CK, has a duty ratio of 50%, the inverse of its pulse width (cycle) is set as a frequency f. Thus, as shown in FIG. 8, when the horizontal axis indicates the path delay value and the vertical axis indicates the pulse width variation coefficient K, the characteristic obtained is such that the value of the pulse width variation amount K decreases as the path delay value increases. Further, the pulse width variation coefficient K decreases as the operation frequency increases (as the cycle time shortens).

The pulse width variation coefficient K having such a characteristic can be expressed as $$K=Ka*f*Tpd+1,$$

in which Ka represents a coefficient (coefficient based on the frequency and the delay value) depending on the cell, the H level pulse, the L level pulse, and the PTV condition, and has a negative value.

The pulse width variation coefficient K is expressed in this manner considering the circuit conditions and the process variations.

[Expression for Checking Pulse Width]

The expression for checking the pulse width using the pulse width variation coefficient K is defined as $$\text{Width}(H) = \{pw(H) + \text{fall} - \text{rise}\} * K > tPW,$$

in which Width(H) represents a pulse width at an input terminal of a target cell, pw(H) represents a pulse width of an externally input signal, fall represents a fall delay value, rise represents a rise delay value, tPW represents a standard value for the target cell, and K represents a pulse width variation coefficient depending on the operation frequency of the circuit and the path delay.

The above expression is used to check an H level pulse width. To check an L level pulse width, the expression of $$\text{Width}(L) = \{pw(L) + \text{rise} - \text{fall}\} * K > tPW$$

is used.

[Verification]

The timing verification apparatus 11 executes the pulse width verification based on the above expression and the value obtained from the above expression. To check the pulse width of the target cell in the circuit, an input pulse width and a delay value of the circuit, which are necessary in the expression for checking the pulse width, are first obtained. An operation frequency and a delay value of an input signal, which are necessary for calculating the pulse width variation coefficient, are then obtained.

For example, an H level pulse width under the worst condition is checked using the expression $$\text{Width}(H) = \{pw(H) + \text{fallmax} - \text{risemax}\} * Kw > tPW,$$

in which fallmax is the fall delay time under the worst condition, risemax is the rise delay value under the worst condition, and Kw is a pulse width variation coefficient using the worst condition as its reference.

An L level pulse width under the worst condition is checked using the expression $$\text{Width}(L) = \{pw(L) + \text{risemax} - \text{fallmax}\} * Kw > tPW.$$

For the same analysis under the best condition, the pulse width variation coefficient using the best condition as its reference is used.

The timing verification will now be described in detail.

[Variation Amount Reduction]

A path delay for a path is influenced by the power supply voltage supplied to each cell in the path. A cell supplied with a low power supply voltage has an operation speed lower than the operation speed of a cell supplied with power supply voltage that is higher than the low power supply voltage. Thus, a cell supplied a low power supply voltage has a larger delay than a cell supplied with higher power supply voltage. The value of the power supply voltage supplied to each cell within the chip differs depending on the position of the power supply in the chip, the arrangement position of the cell within the chip, the cell density, and the amount of current used. In the prior art, it is assumed that the lowest voltage within the chip (the voltage with the largest power supply voltage drop) is supplied to all the cells in the chip.

However, in an actual circuit, the same voltage drop does not occur in all the cells. In other words, one path may include a cell in which the maximum voltage drop has actually occurred and a cell in which a voltage drop smaller than the maximum voltage drop has occurred. Accordingly, the timing verification apparatus 11 sets a drop amount appropriate for each cell within a path and reduces the variation amount of a path delay for the path. In this way, the timing verification apparatus 11 enables the timing verification to be executed in a state similar to an actual chip.

[Drop Amount in Chip]

Figure 9:
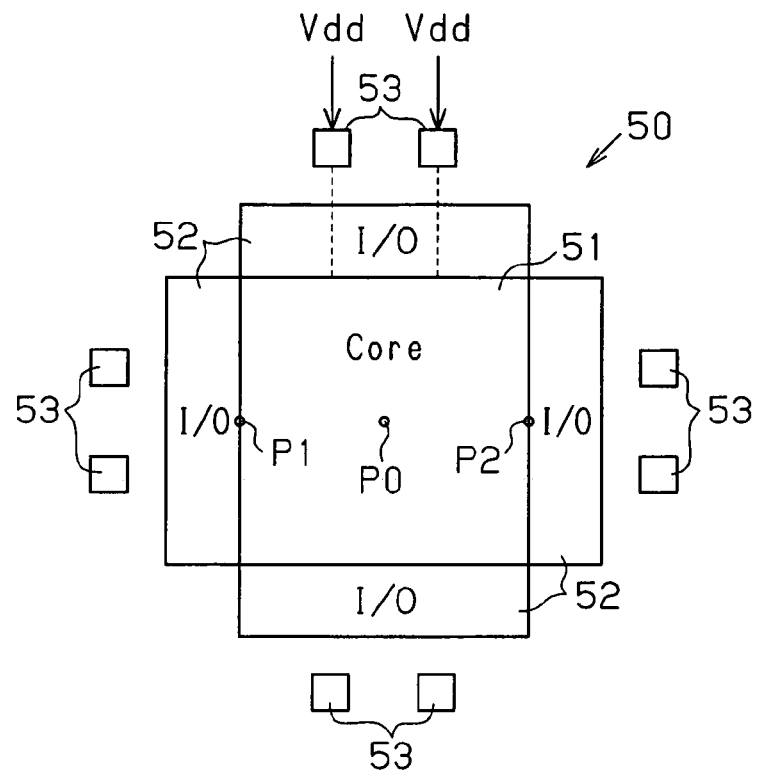
FIG. 9 is a schematic diagram of a semiconductor chip.

A semiconductor chip 50 shown in FIG. 9 includes a plurality of I/O units 52, surrounding a core unit 51, and a plurality of pads 53 arranged at the outer side of the I/O units 52. The pads 53 are used to supply a power supply voltage Vdd.

Figure 10:
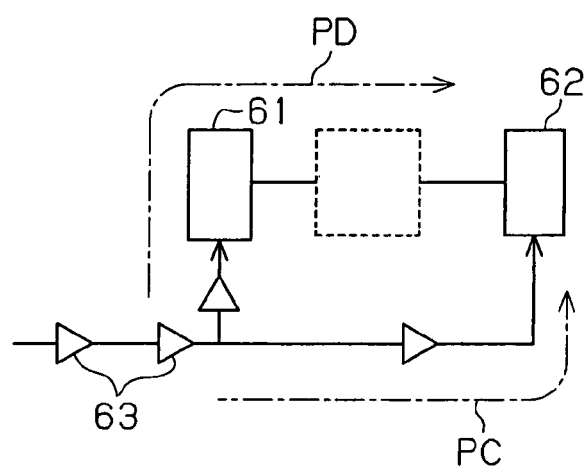
FIG. 10 is a schematic circuit diagram showing a path.
Figure 11:
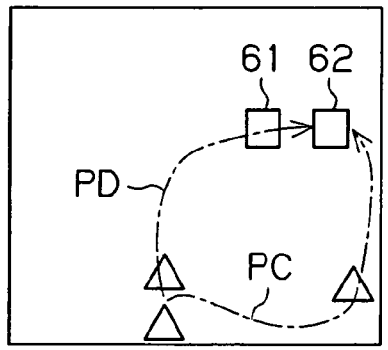
FIGS. 11(a) to 11(d) are diagrams showing the arrangement of paths in the chip.
Figure 11:
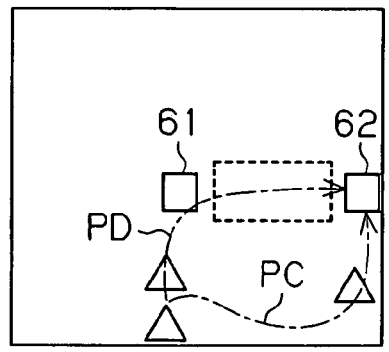
Figure 11:
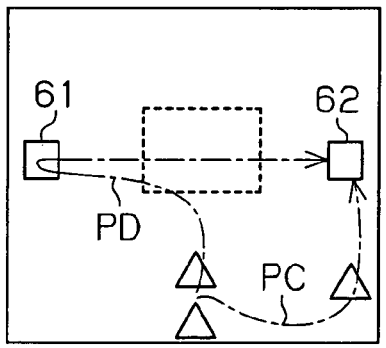
Figure 11:
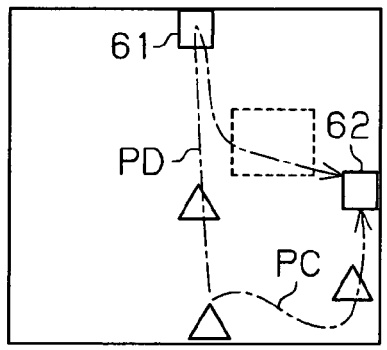

As shown in FIG. 10, the core unit 51 includes a clock path PC for providing a clock signal CK to FFs 61 and 62, and a data path PD for transmitting data. The data path PD is a branch path of the clock signal CK. A plurality of cells are connected between the two FFs 61 and 62. In FIG. 10, the plurality of cells are indicated by the block drawn with a broken line.

Figure 13:
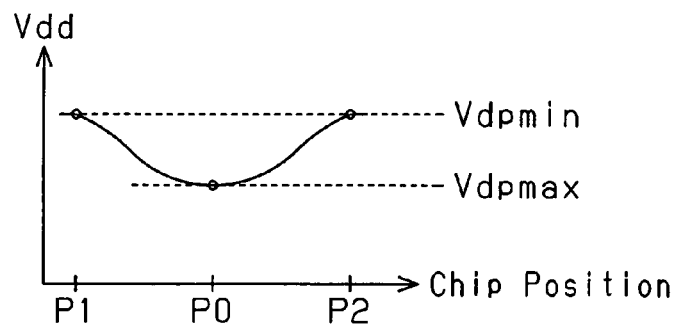
FIG. 13 is a diagram showing the power supply voltage distribution in the semiconductor chip.

FIG. 13 is a diagram describing a power supply voltage distribution in the semiconductor chip 50.

Figure 12:
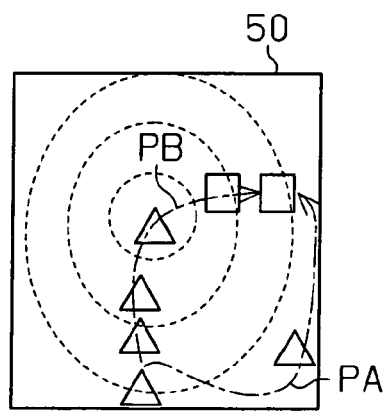
FIG. 12 is a diagram showing the voltage drop distribution in the semiconductor chip.

A drop amount (IRD) of the power supply voltage in the semiconductor chip 50 increases gradually from core peripheral parts P1 and P2 to a core central part P0. As shown in FIG. 12, the power supply voltage drop amount in the semiconductor chip 50 gradually increases from a peripheral part toward a central part of the chip 50. As shown in FIG. 13, the drop amount in the chip 50 is at its maximum value Vdpmax in the core central part P0 and is at its minimum value Vdpmin in the core peripheral parts P1 and P2. The relationship between the IRD and the position in the chip may be expressed using an approximate expression such as a linear function, a quadric function, and an exponential function, as a function of the position in the chip. Here, it is expressed using a standard quadric function.

The data path PD and the clock path PC are determined by the arrangement of the terminal provided with the clock signal CK and the FFs 61 and 62. However, with the power supply voltage drop amounts distributed as shown in FIG. 12, a path PA that extends through the peripheral part of the chip and a path PB that extends through the central part of the chip are most influenced by the IRD.

The length of a path differs depending on the arrangement of the cells in the path. For example, FIG. 11(a) shows how the paths PC and PD extend when the FFs 61 and 62 are arranged close to each other. FIG. 11(b) shows how the paths PC and PD extend when the FFs 61 and 62 are separated from each other. FIGS. 11(c) and 11(d) show how the paths PC and PD extend when the FFs 61 and 62 are further separated from each other.

[Influence of Path Delay]

The timing verification apparatus 11 checks the timings of signals provided to the clock input terminal 62a and the data input terminal 62b of the FF 62 to enable the FF 62 to operate normally. Assuming that the value of the power supply voltage provided to cells forming the clock path PC and the value of the power supply voltage provided to cells forming the data path PD are different, the timing check is executed under a condition in which the delay difference between the clock signal and the data signal becomes small. To be specific, a delay variation coefficient (OCV coefficient) is calculated according to the voltage difference. A delay value considering variations is then calculated based on the OCV coefficient and used in the timing check.

Figure 14A:
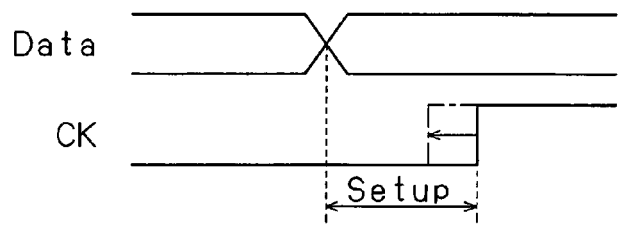
FIGS. 14(a) to 14(d) are waveform diagrams of signals describing influences of path delays.
Figure 14B:
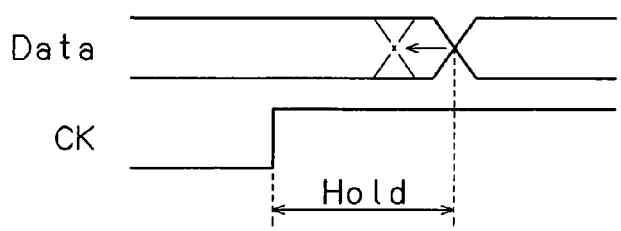

FIG. 14(a) and FIG. 14(b) show how the OCV coefficient is set when the path delay is maximal (slowest value). As shown in FIG. 14(a), the setup timing with respect to the rise of the clock signal CK is checked. A period from the setup timing to the rising timing of the clock signal CK is set as a setup period in which the data Data needs to be determined. The timing check is stricter as the setup period is shorter. The setup period can be shortened by delaying the supply of the data Data or by expediting the rise of the clock signal CK. However, with the slowest value being used, the supply of the data Data cannot be delayed any further. Thus, the OCV coefficient is set at such a value that causes the clock signal CK to rise earlier. Likewise, as shown in FIG. 14(b), to execute the same check in a hold period (period during which the data Data needs to be held after the clock signal CK rises), the OCV coefficient is set at such a value that causes the data Data to be provided earlier.

Figure 14C:
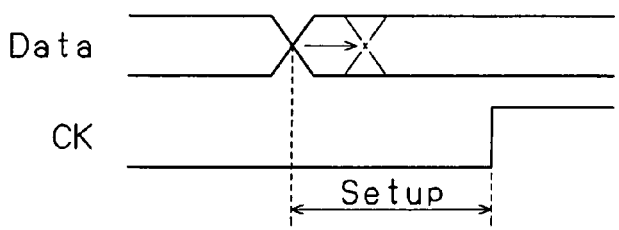
Figure 14D:
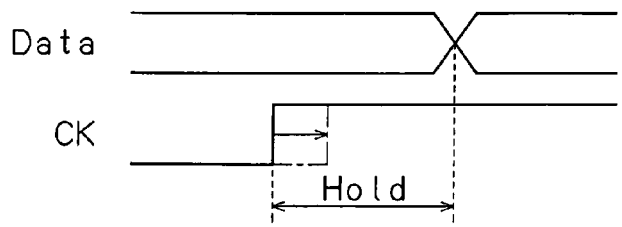

FIG. 14(c) and FIG. 14(d) show how the OCV coefficient is set when the path delay is minimal (fastest value). As shown in FIG. 14(c), the setup timing with respect to the rise of the clock signal CK is checked. The timing check is stricter as the setup period becomes shorter. The setup period is shortened by delaying the supply of the data Data or by expediting the rise of the clock signal CK. However, with the fastest value being used, the rise of the clock signal CK cannot be expedited any further. Thus, the OCV coefficient is set at such a value that causes the supply of the data Data to be delayed. Likewise, to execute the same check in the hold period as shown in FIG. 14(d), the OCV coefficient is set at such a value that causes the clock signal CK to be delayed.

The timing verification apparatus 11 executes the timing check considering on-chip variations using the four methods described above. In this case, the variation of one of the two types of path delays considers on-chip variations. This path delay variation is considered as an influence of the path delay.

To execute the worst analysis, the timing verification apparatus 11 uses such an OCV coefficient that causes the edge timing to be expedited by on-chip variations. To execute the best analysis, the timing verification apparatus 11 uses such an OCV coefficient that causes the edge timing to be delayed by on-chip variations. To be specific, the storage device 14 stores an OCV coefficient for the worst analysis and an OCV coefficient for the best analysis, which are calculated in advance. The timing verification apparatus 11 reads these OCV coefficients from the storage device 14 and uses the read OCV coefficients in the timing verification.

The on-chip variations include process variations, voltage variations, and temperature variations. The delay of a cell needs to consider these variations. In an actual path, the delay of a cell forming the path can be regarded as the delay for the entire path. Thus, the timing verification apparatus 11 handles these variations as the path delay variation.

[Voltage Variations that are to be taken into Consideration in Timing Check]

The semiconductor chip 50 has a voltage distribution depending on the arrangement positions of cells and wires. A path delay variation caused by this voltage distribution is calculated as a value considering a voltage drop amount. For example, in the verification of the timing shown in FIG. 14(d), the delay of the clock path is calculated. In a case in which the data path PD includes four cells, the path delay considering the arrangement positions of the four cells is calculated.

A variation amount of the path delay with respect to a reference potential is approximately calculated. The set value of the reference potential differs depending on the condition employed in the timing verification. For example, when the fastest value is used as shown in FIGS. 14(c) and 14(d), the maximum value of the power supply voltage supplied to the path (e.g., voltage at the input terminal of the chip) is set as the reference potential.

The delay value of the cell to which the reference potential is supplied is set at the path delay value Tpd, and the variation coefficients for the four cells are set at 0.05, 0.1, 0.15, and 0.2, respectively. In this case, the path delay variation is set as $$Tpd*0.05+Tpd*0.1+Tpd*0.15+Tpd*0.2=4*Tpd*0.5=4*(Tpd*0.125).$$

Thus, the path delay variation of 4*Tpd*0.5 is considered. In the prior art, the variation coefficient for the maximum drop amount, which may be set at 0.2, is used for all the cells. Thus, in the prior art, the path delay variation of 4*(Tpd*0.2)=4*Tpd*0.8 is considered.

To consider path variations, an average variation, which is obtained by dividing the path delay variation by the number of cells, is to be considered as the delay for each cell. In the above calculation, the path delay variation is 4*(Tpd*0.125). Thus, the delay for each cell is calculated using the variation coefficient 0.125.

The delay variation has a correlation with the voltage variation. Thus, an average voltage variation may be used to obtain the average delay variation.

The delay variation in the data path PD can be calculated in the same manner as the calculation of the delay variation in the clock path PC described above. When the slowest value is used as shown in FIG. 14(a) and FIG. 14(b), the minimum value of the power supply voltage in the path (e.g., voltage in the central part of the chip) is set as the reference potential, and the path delay variation can be calculated in the same manner as described above.

[Correlation between Clock Path and Data Path]

When the timing check considering voltage variations is necessary, a case in which the clock path and the data path are separated, or a case in which the clock path and the data path are arranged in different voltage drop areas within the chip needs to be considered.

When the arrangement position of the FF, the arrangement position of the input terminal of the clock signal CK for driving the FF, and the branch position of the clock signal CK are close to one another, the voltage drop variation is small. Thus, the verification executed in this case does not consider the voltage distribution.

When the arrangement position of the FF, the arrangement position of the input terminal of the clock signal CK for driving the FF, and the branch position of the clock signal CK are separated from one another, there is an influence of the voltage drop variation. However, even when the path is relatively long, cells may be arranged at substantially uniform intervals or the net may be divided because of the wiring length limitation, delay optimization, slew control, and cross stroke preventive measures. Thus, the cells of the data path and the cells of the clock path are seldom arranged in completely different areas.

Further, a plurality of cells, which are included in a path extending through an area with a large voltage drop (the path PB shown in FIG. 12), are supplied with a power supply voltage according to the voltage distribution of the path. The maximum drop amount does not need to be considered for all the cells included in the path. In other words, a path that is formed to extend through a plurality of areas with different voltages needs to consider voltage drops. To be specific, the relatively long clock path PC must take into consideration voltage drops. The clock path PC includes a buffer cell and is regarded to have a uniformly distributed load. The clock path PC only needs to consider an average delay variation, as described above.

A short data path and a group of random logic circuits are less likely to be influenced by a voltage drop. Thus, the timing verification apparatus 11 considers an average value of variations in the entire chip. Consideration of the average value enables a practically sufficient margin to be obtained.

[Consideration of Instance Voltage Value]

In some cases, the OCV coefficient is considered from the initial stage of designing. Thus, a possible drop amount needs to be considered before a drop value in each instance is determined (in the initial stage of designing before layout).

A path arranged in a maximum drop area is most influenced by a drop amount. Thus, assuming the maximum drop amount, the number of instances in the path, and the drop distribution within the chip, a drop value of each instance within the path is calculated, and an average value of the drop values is calculated.

The drop value of each instance is calculated assuming the maximum drop amount, the number of instances in the path, and the voltage distribution within the chip in an actual layout. This enables a practical OCV coefficient to be calculated.

[Calculation Method of Variation Amount taking into Consideration OCV]

The variation amount considering an OCV is calculated using an average value of voltage variation amounts of the instances included in the path. Thus, the voltage variation amount is calculated using the expression voltage variation amount=E(variation amounts of instances in path)/(number of instances in path).

The variation amount of each instance indicates its deviation from a reference voltage value. When a delay amount smaller than its reference value is used in the verification, a drop amount of each instance is set as a variation amount of each instance. When a delay amount larger than its reference value is used in the verification, the difference between a maximum drop amount and a drop amount of each instance is set as a variation amount of each instance.

However, there may be a case in which a drop amount of each instance in the path is not known. The distribution of voltage drop amounts in the chip is determined only after the layout of the semiconductor chip is completed and the parasitic capacitance and the power supply net are determined. There may be many violations unless the drop amount is considered before the parasitic capacitance and the power supply net are determined or before the layout of the semiconductor chip is completed. Thus, it is necessary to estimate (predict) the drop amount and shape (potential difference distribution) as accurately as possible. In this manner, the timing verification apparatus 11 executes an analysis with the methods described below when the arrangement position of each instance or the potential difference distribution is not known.

(1) The voltage value of each instance is obtained using the number of instances (cells) included in the path, the drop distribution tendency, and the maximum drop amount. Then, the average value of the drop amounts of the instances is calculated.

A drop amount for each cell is calculated assuming that the number of cells in the path, the drop distribution tendency, and the maximum drop amount have been input, and that the cells have been arranged at uniform intervals in the path having the maximum drop.

The calculation of the drop amount of each cell is possible if the number (minimum number) of cells included in the clock path and in the data path can be estimated, the tendency of the potential difference distribution (voltage drop) can be substantially estimated, and the peak value can be obtained.

Figure 15A:
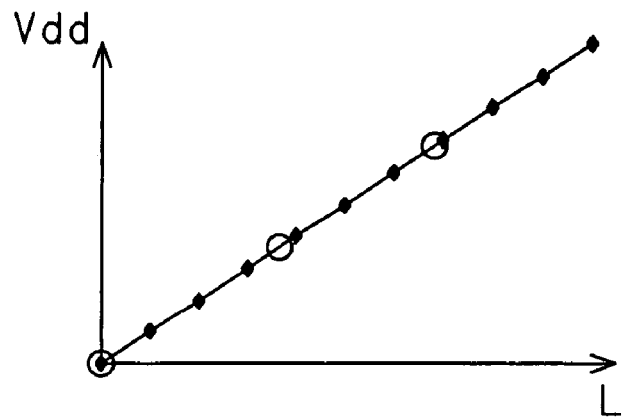
FIGS. 15(a) to 15(c) are graphs showing the relationship between positions on the chip and the voltage drop.
Figure 15B:
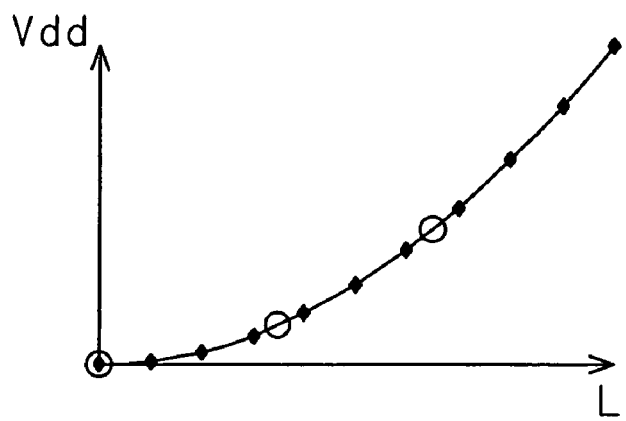
Figure 15C:
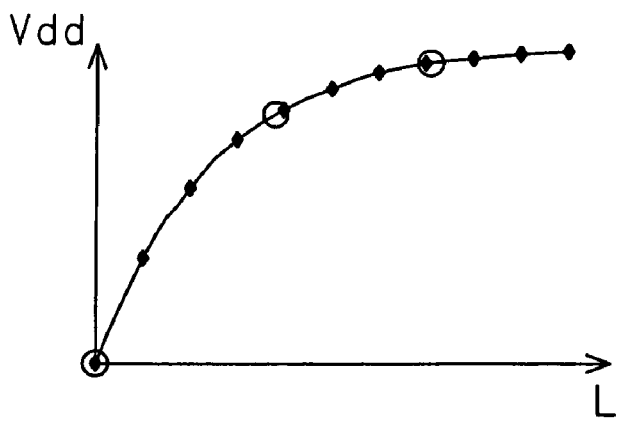

FIGS. 15(a) to 15(c) are graphs showing the relationship between the distance L from the center of the chip and the value of the power supply voltage. As shown in FIGS. 15(a) to 15(c), the drop distribution tendency with respect to distance L includes tendencies expressed by a linear gradient, a quadratic curve gradient, and an exponential function gradient. Based on a distribution tendency selected from these tendencies, a drop amount for each of the instances arranged at uniform intervals is calculated.

(2) The number of cells is calculated using the length (distance) of the path and the wiring length limitation value. The voltage value of each instance is obtained using the drop amount distribution tendency and the maximum drop amount. An average value of the drop amounts of the instances is then calculated.

In this case, the number of cells in the path is not known. However, the chip size can be roughly estimated. Thus, the length of the path can be estimated based on the chip size. If the limitation (frequency) in designing is determined, the slew rate (waveform skew) is limited, and the wiring length limitation may be roughly determined. The number of cells in the path can be estimated based on the length of the path and the wiring length limitation. When the number of cells in the path cannot be estimated, the number of cells is calculated based on the distance of the path and the wiring length limitation value. Then, a drop amount for each instance is calculated.

(3) A voltage value for each instance is obtained based on information for the arrangement of the instances. Then, the average value of the drop amounts of the instances is calculated.

Based on the estimated arrangement position of each instance in the path, a voltage value for each instance is calculated. If the arrangement position of each instance can be roughly confirmed from a floor plan, a drop amount of each instance can be roughly calculated. The distance from the periphery of the chip or the center of the chip to the cell is approximately calculated, and the voltage drop in the cell is calculated. With the above method (1), the cells are assumed to be arranged at uniform intervals. However, the accuracy of the voltage value of each instance is further improved by using such distance information including the distance from the periphery or the distance between paths.

[Procedure for OCV Coefficient Calculation]

The OCV coefficient is calculated using a delay coefficient graph based on process, temperature, and voltage conditions, assuming that the delay value in a typical process, temperature, and voltage is "1".

The OCV coefficient is calculated under a designated condition where a voltage, a temperature condition, and an estimated variation amount of the designed circuit are designated. FIG. 16 shows OCV coefficients resulting from the calculation. FIG. 17 shows OCV coefficients calculated with the prior art methods.

Figure 18A:
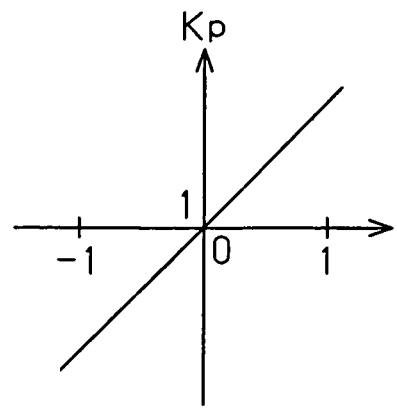
FIG. 18(a) is a graph showing the relationship between the process and the variation coefficient.

To be specific, as shown in FIG. 18(a), a graph showing the relationship between a value obtained by normalizing a process variation amount (a value for a typical process is set as "0", a worst process is set as "1", and a best process is set as "−1") and a process delay coefficient Kp (actually a map storing characteristic data) is used. This map is stored in the storage device 14. In this state, the delay coefficient Kp is set at 1.2 when the value expressing the process variation amount is "+1", and set at 0.8 when the value is "−1".

Figure 18B:
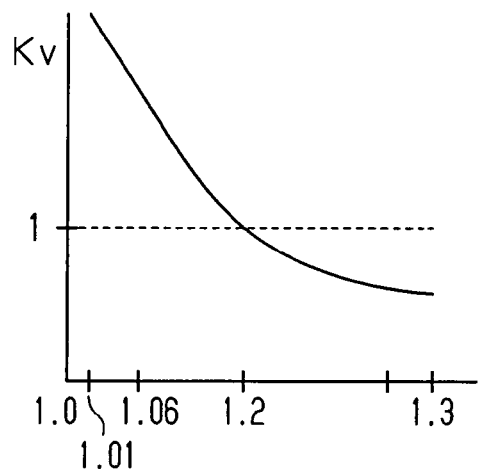
FIG. 18(b) is a graph showing the relationship between the power supply voltage and the variation coefficient.
Figure 18C:
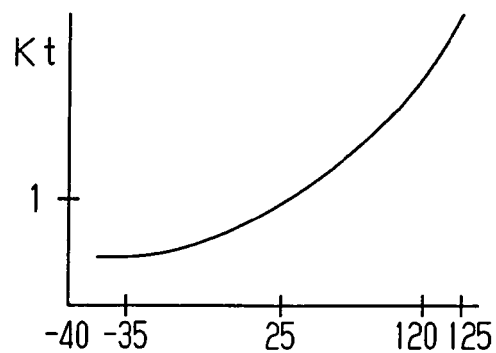
FIG. 18(c) is a graph showing the relationship between the temperature and the variation coefficient.

A power supply voltage delay coefficient Kv shows a characteristic in a range of power supply voltages of 1.0 to 1.3 V as shown in FIG. 18(*b*). A temperature delay coefficient Kt shows the characteristic in a temperature range of −40 to 125° C. as shown in FIG. 18(*c*). Using maps storing such characteristic data, the coefficients Kv and Kt according to a designated condition (power supply voltage and temperature) are obtained. A reference OCV coefficient is calculated using the obtained coefficients Kp, Kv, and Kt.

Although the above procedure describes the method for handling the voltage variations, the same procedure applies to the method for handling the temperature variations. For example, when the temperature distribution in the chip is obtained in the same manner as the voltage drop distribution, the temperature OCV coefficient is obtained with the same method as the above-described method for obtaining the voltage OCV coefficient.

The timing verification apparatus 11 of the present embodiment has the advantages described below.

(1) The timing verification apparatus 11 calculates the pulse width Width (H) at the input terminals 31*a* and 44*a* of the FFs 31 and 44 for transmitting the clock signal CK using the pulse width variation coefficient k according to the pulse width of the clock signal CK, the delay value of the clock signal CK, and the operation frequency. The timing verification apparatus 11 compares the final pulse width Width (H) with the standard value tPW. In the calculation of the pulse width at the input terminals 31*a* and 44*a* of the FFs 31 and 44, the pulse width of the clock signal CK and the rise delay and the fall delay of the path are used. In this way, the rise delay and the fall delay under the same condition are used, and the variation amount of the pulse width itself is handled, so that the pulse width at the input terminals 31*a* and 44*a* of the FFs 31 and 44 is correctly calculated. This executes verification with high accuracy.

(2) The pulse width variation coefficient K is a ratio of the pulse width considering delay variations to the reference pulse width. The reference pulse width is set based on a process condition (worst or best condition). This easily executes the verification in each process condition.

(3) The pulse width variation coefficient K is calculated using the path delay value Tpd, the signal frequency f, and the coefficient Ka based on the frequency and the delay value. This enables the pulse width variation to be expressed using the correlation between the operation frequency and the delay value of the input signal. Thus, the verification is easily executed.

(4) The timing verification apparatus 11 determines a variation amount for the clock path PC transmitting a clock signal and a variation amount for the data path PD transmitting a data signal in the semiconductor chip 50, and converts the variation amount for each path into a delay coefficient for each path. The timing verification apparatus 11 checks the timing for each signal at the input terminal of the FF 62 based on the delay coefficient for each path. Thus, the variation amount for each path is reduced. This executes timing verification more accurately than when a maximum value of possible variations in the chip is considered.

(5) The variation amount for each cell is set as a voltage drop amount for each cell with respect to the reference voltage. Thus, timing verification is executed considering delays according to the power supply voltage supplied to each cell. This enables verification to be executed more accurately than when the maximum voltage drop amount is used in the verification.

(6) To set the variation amount for each path, the value of the power supply voltage in each instance is calculated using the number of cells included in each path, the voltage distribution, and the maximum voltage drop amount. The average value of the voltage values is calculated, and the calculated average voltage value is set as the power supply voltage for each instance. As a result, the path delay is approximately calculated when the layout has not yet been determined, and the timing verification is executed at an early stage.

(7) The number of instances included in each path is calculated using the length of the path and the wiring length limitation value. As a result, the path delay is approximately calculated when the number of instances have not yet been determined. Thus, the verification is executed at an early stage.

It should be apparent to those skilled in the art that the present invention may be embodied in many other specific forms without departing from the spirit or scope of the invention. Particularly, it should be understood that the present invention may be embodied in the following forms.

In the above embodiment, the timing check and the pulse width check are executed at the same time. However, the timing check and the pulse width check may be executed separately. In this case, the processing necessary for the timing check and the processing necessary for the pulse width check may be executed using different programs.

Although the above embodiment describes a case in which the timings for the data signal and the clock signal (setup time and hold time) are verified, other timings (removal time and recovery time, etc.) may be verified. The removal time is the time from when data at a specified input terminal is released to when an input at another relevant input terminal (e.g., clock input) is enabled to be changed. In this case, in addition to the clock signal and the data signal, control signals such as an enable signal, and signals provided to a clear terminal and a preset terminal may be subjected to the verification.

In the above embodiment, the timing check is executed based on the voltage variation amount. However, the timing check may be executed based on a temperature variation amount or a process variation amount.

The present examples and embodiments are to be considered as illustrative and not restrictive, and the invention is not to be limited to the details given herein, but may be modified within the scope and equivalence of the appended claims.

What is claimed is:

1. A method for verifying a pulse width of a signal that is delayed when passing through an instance, the method comprising:

calculating a pulse width variation coefficient that is based on the pulse width of the signal and a delay value of the signal, wherein the pulse width variation coefficient is expressed as a ratio obtained by dividing a pulse width taking into consideration signal delay variations by the pulse width of the signal under a predetermined condition;

calculating a pulse width for the delayed signal using the pulse width variation coefficient; and comparing the calculated pulse width of the delayed signal with a predetermined value.

2. The method according to claim 1, wherein said calculating a pulse width variation coefficient includes calculating the pulse width variation coefficient based on the pulse width of the signal, the delay value of the signal, and an operation frequency that is in accordance with the pulse width of the signal.

3. The method according to claim 1, wherein said calculating a pulse width of the delayed signal includes calculating the pulse width of the delayed signal using the pulse width variation coefficient, the pulse width of the signal, a rise delay value that is expressed as a time difference between rising edges of the signal and the delayed signal, and a fall delay value that is expressed as a time difference between falling edges of the signal and the delayed signal.

4. The method according to claim 1, wherein the signal has a frequency and is delayed when passing through a path including the instance, and said calculating a pulse width variation coefficient includes calculating the pulse width variation coefficient with a delay value for the path, the frequency of the signal, and a coefficient that is based on the frequency and the delay value.

5. An apparatus for verifying a pulse width of a signal that is delayed when passing through a circuit device, the apparatus comprising:
a processing unit including,
a calculation unit calculating a pulse width variation coefficient, based on the pulse width of the signal and a delay value of the signal, and for calculating a pulse width of the delayed signal using the pulse width variation coefficient, wherein the pulse width variation coefficient is expressed as a ratio obtained by dividing a pulse width taking into consideration signal delay variations by the pulse width of the signal under a predetermined condition, and
a comparison unit comparing the calculated pulse width of the delayed signal with a predetermined value.

6. A method for verifying timing of a signal that is delayed when passing through clock and data paths having different end points, the method comprising:
determining a first delay variation amount for the clock path and a second delay variation amount for the data path;
converting the first and second delay variation amounts into first and second delay coefficients, respectively;
calculating a first delay value for the clock path based on the first delay variation amount and calculating a second delay value for the data path based on the second delay variation amount; and
verifying the timing of the signal based on the calculated first and second delay values.

7. A method for verifying timing of a signal that is delayed when passing through at least two paths having different end points, the method comprising:
determining a delay variation amount entirely for the at least two paths;
converting the delay variation amount into a delay coefficient for each path;
calculating a delay value entirely for the at least two paths based on the delay coefficient; and
verifying the timing of the signal based on the calculated delay value,
wherein each of the at least two paths includes a plurality of instances, and said determining a delay variation amount includes dividing the sum of all the individual variation amounts for the instances in each path by the number of the instances in each path to obtain the delay variation amount.

8. The method according to claim 7, wherein the delay variation amount for each instance is expressed as a difference between a reference voltage and a power supply voltage supplied to each instance.

9. The method according to claim 7, wherein each instance is supplied with a dropped power supply voltage, the method further comprising:
setting a drop amount of the dropped power supply voltage supplied to each instance as a delay variation amount for each instance when the delay value used in verifying the signal timing is smaller than a reference value; and
setting a difference between a maximum drop amount and the drop amount of the dropped power supply voltage supplied to each instance as the delay variation amount for each instance when the delay value used in verifying the signal timing is larger than the reference value.

10. A method for verifying timing of a signal that is delayed when passing through at least two paths having different end points, the method comprising:
determining a delay variation amount entirely for the at least two paths;
converting the delay variation amount into a delay coefficient for each path;
calculating a delay value entirely for the at least two paths based on the delay coefficient; and
verifying the timing of the signal based on the calculated delay value,
wherein each of the at least two paths includes a plurality of instances, and each instance is supplied with a power supply voltage, the method further comprising:
calculating a value for the power supply voltage supplied to each instance based on the number of instances in each of the at least two paths, a power supply voltage distribution, and a maximum voltage drop amount; and
averaging the calculated power supply voltage values and calculating a variation amount for the power supply voltage as a delay variation amount.

11. The method according to claim 10, further comprising:
calculating the number of the instances in each of the at least two paths based on the length of each path and a wiring length limitation value of each path.

12. The method for verifying timing of a signal that is delayed when passing through at least two paths having different end points of claim 11, wherein the at least two paths include a clock path and a data path.

13. A method for verifying timing of a signal that is delayed when passing through at least two paths having different end points, the method comprising:
determining a delay variation amount entirely for the at least two paths;
converting the delay variation amount into a delay coefficient for each path;
calculating a delay value entirely for the at least two paths based on the delay coefficient; and
verifying the timing of the signal based on the calculated delay value,
wherein each of the at least two paths includes a plurality of instances, and each instance is supplied with a power supply voltage, the method further comprising:
calculating a value for the power supply voltage supplied to each instance based on arrangement information of the at least two paths; and
averaging the calculated power supply voltage values and calculating a variation amount for the power supply voltage as the delay variation amount.

14. The method according to claim 13, wherein said converting the delay variation amount into a delay coefficient includes calculating an on-chip variation coefficient as the delay coefficient while taking into consideration the calculated variation amount of the power supply voltage.

15. A method for verifying timing of a signal that is delayed when passing through at least two paths having different end points, the method comprising:

determining a delay variation amount entirely for the at least two paths;

converting the delay variation amount into a delay coefficient for each path;

calculating a delay value entirely for the at least two paths based on the delay coefficient;

verifying the timing of the signal based on the calculated delay value;

obtaining a delay value in accordance with a condition designated using coefficient characteristic data including a predetermined delay value, for a predetermined process condition, temperature, and voltage, and a changed delay value; and calculating an on-chip variation coefficient as the delay coefficient using the obtained delay value.

16. An apparatus for verifying timing of a signal that is delayed when passing through a clock path and a data path, the apparatus comprising:

a processing unit including, a determination unit determining a first delay variation amount for the clock path and a second delay variation amount for the data path, a calculation unit converting the first and second delay variation amounts into first and second delay coefficients, respectively, calculating a first delay value for the clock path based on the first delay variation amount, and calculating a second delay value for the data path based on the second delay variation amount, and a verification unit verifying the timing of the signal based on the calculated delay value.

* * * * *